(12) United States Patent
Wu et al.

(10) Patent No.: US 12,062,689 B2
(45) Date of Patent: Aug. 13, 2024

(54) MANUFACTURING METHOD OF CAPACITOR STRUCTURE

(71) Applicant: Fujian Jinhua Integrated Circuit Co., Ltd., Quanzhou (CN)

(72) Inventors: Chia-Wei Wu, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/509,268

(22) Filed: Nov. 14, 2023

(65) Prior Publication Data
US 2024/0088209 A1   Mar. 14, 2024

Related U.S. Application Data

(63) Continuation of application No. 17/542,480, filed on Dec. 5, 2021, now Pat. No. 11,862,666.

(30) Foreign Application Priority Data

Oct. 28, 2021  (CN) .......................... 202111266442.7
Oct. 28, 2021  (CN) .......................... 202122616148.6

(51) Int. Cl.
*H10B 12/00*     (2023.01)
*H01L 49/02*     (2006.01)
(52) U.S. Cl.
CPC ........... *H01L 28/91* (2013.01); *H10B 12/033* (2023.02)

(58) Field of Classification Search
None
See application file for complete search history.

(56) References Cited

U.S. PATENT DOCUMENTS

| | | |
|---|---|---|
| 7,442,981 B2 | 10/2008 | Nam |
| 8,760,845 B2 | 6/2014 | Rocklein |
| 2009/0309187 A1 | 12/2009 | Choi |
| 2012/0292584 A1 | 11/2012 | Rocklein |
| 2013/0143384 A1 | 6/2013 | Malhotra |

*Primary Examiner* — Robert G Bachner
*Assistant Examiner* — Molly K Reida
(74) *Attorney, Agent, or Firm* — Winston Hsu

(57) ABSTRACT

A capacitor structure and a manufacturing method thereof are disclosed in this invention. The capacitor structure includes a first electrode, a second electrode, and a capacitor dielectric stacked layer. The capacitor dielectric stacked layer is disposed between the first electrode and the second electrode, and the capacitor dielectric stacked layer includes a first dielectric layer. The first dielectric layer includes a first zirconium oxide layer and a first zirconium silicon oxide layer. A manufacturing method of a capacitor structure includes the following steps. A capacitor dielectric stacked layer is formed on a first electrode, and the capacitor dielectric stacked layer includes a first dielectric layer. The first dielectric layer includes a first zirconium oxide layer and a first zirconium silicon oxide layer. Subsequently, a second electrode is formed on the capacitor dielectric stacked layer, and the capacitor dielectric stacked layer is located between the first electrode and the second electrode.

20 Claims, 14 Drawing Sheets

MANUFACTURING METHOD OF CAPACITOR STRUCTURE

CROSS REFERENCE TO RELATED APPLICATIONS

This application is a continuation application of U.S. application Ser. No. 17/542,480, filed on Dec. 5, 2021. The content of the application is incorporated herein by reference.

BACKGROUND OF THE INVENTION

1. Field of the Invention

The present invention relates to a capacitor structure and a manufacturing method thereof, and more particularly, to a capacitor structure including a capacitor dielectric stacked layer and a manufacturing method thereof.

2. Description of the Prior Art

In modern society, the micro-processor systems composed of integrated circuits (ICs) are applied popularly in our living. Many electrical products, such as personal computers, mobile phones, and home appliances, include ICs. With the development of technology and the increasingly imaginative applications of electrical products, the design of ICs tends to be smaller, more delicate and more diversified. In the recent electrical products, IC devices, such as metal oxide semiconductor (MOS) transistors, capacitors, or resistors, are produced from silicon based substrates that are fabricated by semiconductor manufacturing processes. A complicated IC system may be composed of the IC devices electrically connected with one another. Generally, a capacitor structure may be composed of a top electrode, a dielectric layer, and a bottom electrode, such as having a metal-insulator-metal (MIM) capacitor structure. However, as the function and performance demands of electronic products continue to increase, the operation performance demand of the capacitor structure has also increased relatively. Therefore, how to modify the structural design and/or the manufacturing method of the capacitor structure to meet product requirements has always been the research direction of the related fields.

SUMMARY OF THE INVENTION

A capacitor structure and a manufacturing method thereof are provided in the present invention. A capacitor dielectric stacked layer including a zirconium oxide layer and a zirconium silicon oxide layer is disposed between two electrodes of a capacitor structure. The leakage current of the capacitor structure may be reduced by the zirconium silicon oxide layer, and the operating performance of the capacitor structure may be enhanced accordingly.

According to an embodiment of the present invention, a capacitor structure is provided. The capacitor structure includes a first electrode, a second electrode, and a capacitor dielectric stacked layer. The capacitor dielectric stacked layer is disposed between the first electrode and the second electrode, and the capacitor dielectric stacked layer includes a first dielectric layer. The first dielectric layer includes a first zirconium oxide layer and a first zirconium silicon oxide layer.

According to an embodiment of the present invention, a manufacturing method of a capacitor structure is provided. The manufacturing method includes the following steps. A capacitor dielectric stacked layer is formed on a first electrode, and the capacitor dielectric stacked layer includes a first dielectric layer and an aluminum oxide layer. The first dielectric layer includes a first zirconium oxide layer and a first zirconium silicon oxide layer. The first dielectric layer is disposed between the aluminum oxide layer and the first electrode, and a thickness of the first zirconium oxide layer is greater than a thickness of the aluminum oxide layer. Subsequently, a second electrode is formed on the capacitor dielectric stacked layer, and the capacitor dielectric stacked layer is located between the first electrode and the second electrode.

According to an embodiment of the present invention, a manufacturing method of a capacitor structure is provided. The manufacturing method includes the following steps. A capacitor dielectric stacked layer is formed on a first electrode, and the capacitor dielectric stacked layer includes a first dielectric layer. The first dielectric layer includes a first zirconium oxide layer, a first zirconium silicon oxide layer, a second zirconium oxide layer, and a silicon oxide layer. The first zirconium silicon oxide layer is disposed between the first zirconium oxide layer and the second zirconium oxide layer, and the silicon oxide layer is disposed between the first zirconium oxide layer and the second zirconium oxide layer. Subsequently, a second electrode is formed on the capacitor dielectric stacked layer, and the capacitor dielectric stacked layer is located between the first electrode and the second electrode.

According to an embodiment of the present invention, a manufacturing method of a capacitor structure is provided. The manufacturing method includes the following steps. A capacitor dielectric stacked layer is formed on a first electrode, and the capacitor dielectric stacked layer includes a dielectric layer. The dielectric layer includes a plurality of zirconium oxide layers and a plurality of zirconium silicon oxide layers alternately stacked. A thickness of each of the zirconium oxide layers is greater than a thickness of each of the zirconium silicon oxide layers. Subsequently, a second electrode is formed on the capacitor dielectric stacked layer, and the capacitor dielectric stacked layer is located between the first electrode and the second electrode.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
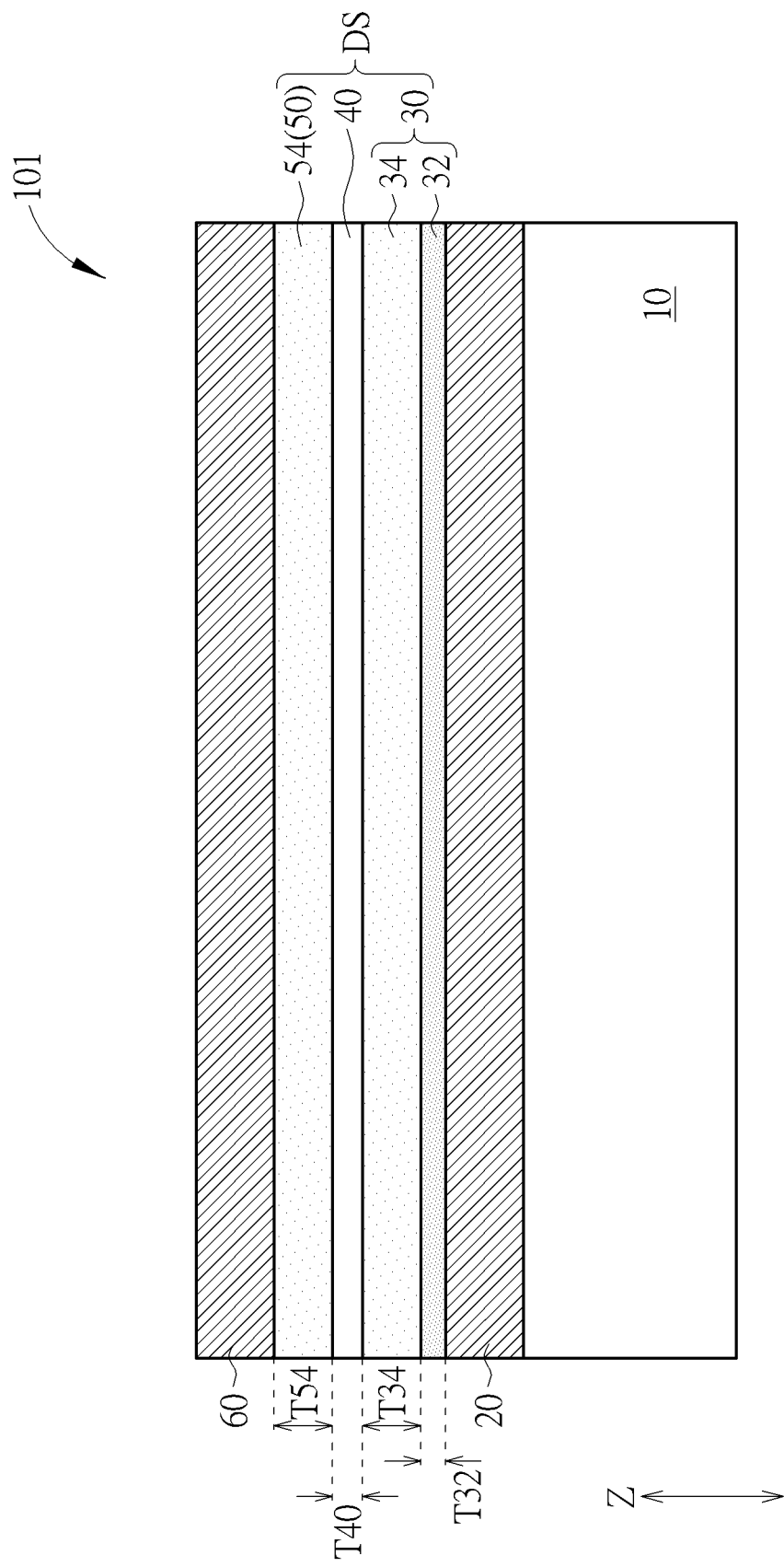
FIG. 1 is a schematic drawing illustrating a capacitor structure according to a first embodiment of the present invention.

Please refer to FIG. 1. FIG. 1 is a schematic drawing illustrating a capacitor structure 101 according to a first embodiment of the present invention. As shown in FIG. 1, the capacitor structure 101 includes a first electrode 20, a second electrode 60, and a capacitor dielectric stacked layer DS. The capacitor dielectric stacked layer DS is disposed between the first electrode 20 and the second electrode 60, and the capacitor dielectric stacked layer DS includes a first dielectric layer (such as a dielectric layer 30 illustrated in FIG. 1). The dielectric layer 30 includes a first zirconium oxide layer (such as a zirconium oxide layer 34 illustrated in FIG. 1) and a first zirconium silicon oxide layer (such as a zirconium silicon oxide layer 32 illustrated in FIG. 1). The zirconium silicon oxide layer 32 may be used to change the energy band distribution in the dielectric layer 30 and the capacitor dielectric stacked layer DS and/or reduce the leakage current path (such as a leakage current path generated by crystalline grain boundary of crystalline zirconium oxide, but not limited thereto), and the leakage current of the capacitor structure 101 may be reduced accordingly for enhancing the operation performance of the capacitor structure 101.

In some embodiments, the capacitor structure 101 may be disposed on a substrate 10, the first electrode 20 may be disposed between the capacitor dielectric stacked layer DS and the substrate 10 in a vertical direction Z, and the capacitor dielectric stacked layer DS may be disposed between the first electrode 20 and the second electrode 60 in the vertical direction Z. Therefore, the first electrode 20 may be regarded as a bottom electrode and the second electrode 60 may be regarded as a top electrode, but not limited thereto. In some embodiments, the substrate 10 may include a semiconductor substrate or a non-semiconductor substrate. The semiconductor substrate may include a silicon substrate, a silicon germanium semiconductor substrate, or a silicon-on-insulator (SOI) substrate, and the non-semiconductor substrate may include a glass substrate, a plastic substrate, or a ceramic substrate, but not limited thereto. Additionally, other active components (such as a transistor structure, not illustrated) and/or other passive components may be disposed in the substrate according to some design considerations, and the capacitor structure 101 may be electrically connected with the active component and/or the passive component. For example, the capacitor structure 101 may be electrically connected with a transistor structure for forming a memory unit, but not limited thereto.

In some embodiments, the first electrode 20 and the second electrode 60 may respectively include a single layer or multiple layers of electrically conductive materials, such as titanium nitride (TiN), tantalum nitride (TaN), tungsten nitride (WN), platinum (Pt), or other suitable metallic conductive materials or non-metallic conductive materials. Additionally, in some embodiments, the zirconium oxide layer 34 may be pure zirconium oxide (such as consisting of zirconium oxide only) or be nearly pure zirconium oxide (such as including zirconium oxide and some unintentionally doped impurities), and an atomic percentage (at. %) of zirconium in the zirconium oxide layer 34 may be higher than an atomic percentage of zirconium in the zirconium silicon oxide layer 32 accordingly. In addition, the zirconium silicon oxide layer 32 may be used to reduce the leakage current, but the dielectric constant of the zirconium silicon oxide layer 32 is lower than that of the zirconium oxide layer 34. Therefore, a thickness T34 of the zirconium oxide layer 34 in the vertical direction Z may be greater than a thickness T32 of the zirconium silicon oxide layer 32 in the vertical direction Z for reducing the influence on the permittivity and/or the capacitance density of the capacitor dielectric stacked layer DS, but not limited thereto. In some embodiments, the zirconium silicon oxide layer 32 may be disposed between the zirconium oxide layer 34 and the first electrode 20 in the vertical direction Z, but not limited thereto. In other words, in some embodiments, the zirconium oxide layer 34 may be disposed between the zirconium silicon oxide layer 32 and the first electrode 20 in the vertical direction Z.

In some embodiments, the capacitor dielectric stacked layer DS may further include an aluminum oxide layer 40, and the dielectric layer 30 may be disposed between the aluminum oxide layer 40 and the first electrode 20, but not limited thereto. In other words, in some embodiments, the dielectric layer 30 including the zirconium oxide layer 34 and the zirconium silicon oxide layer 32 may be disposed between the aluminum oxide layer 40 and the second electrode 60 in the vertical direction Z according to some design considerations. In some embodiments, the aluminum oxide layer 40 may have relatively higher crystallization temperature and/or greater energy barrier for reducing the leakage current generated by the zirconium oxide layer, but the dielectric constant of the aluminum oxide layer 40 is relatively lower (such as being lower than that of the zirconium oxide layer 34 and being lower than that of the zirconium silicon oxide layer 32). Therefore, the thickness T34 of the zirconium oxide layer 34 may be greater than a thickness T40 of the aluminum oxide layer 40 in the vertical direction Z for reducing the influence of the aluminum oxide layer 40 on the permittivity and/or the capacitance density of the capacitor dielectric stacked layer DS. Additionally, in some embodiments, the zirconium oxide layer 34 in the dielectric layer 30 may be disposed between the zirconium silicon oxide layer 32 and the aluminum oxide layer 40 in the vertical direction Z for reducing the influence of silicon in the zirconium silicon oxide layer 32 on the aluminum oxide layer 40, but not limited thereto. In some embodiments, the capacitor dielectric stacked layer DS may further include a second dielectric layer (such as a dielectric layer 50 illustrated in FIG. 1) disposed between the aluminum oxide layer 40 and the second electrode 60. The dielectric layer 50 may include a zirconium oxide layer 54, and the material composition of the zirconium oxide layer 54 may be identical to the material composition of the zirconium oxide layer 34, but not limited thereto. In some embodiments, the zirconium oxide layer 54 may be pure zirconium oxide (such as consisting of zirconium oxide only) or be nearly pure zirconium oxide (such as including zirconium oxide and some unintentionally doped impurities). Therefore, an atomic percentage of zirconium in the zirconium oxide layer 54 may be higher than the atomic percentage of zirconium in the zirconium silicon oxide layer 32, and a thickness T54 of the zirconium oxide layer 54 in the vertical direction Z may be greater than the thickness T32 of the zirconium silicon oxide layer 32, but not limited thereto.

Figure 2:
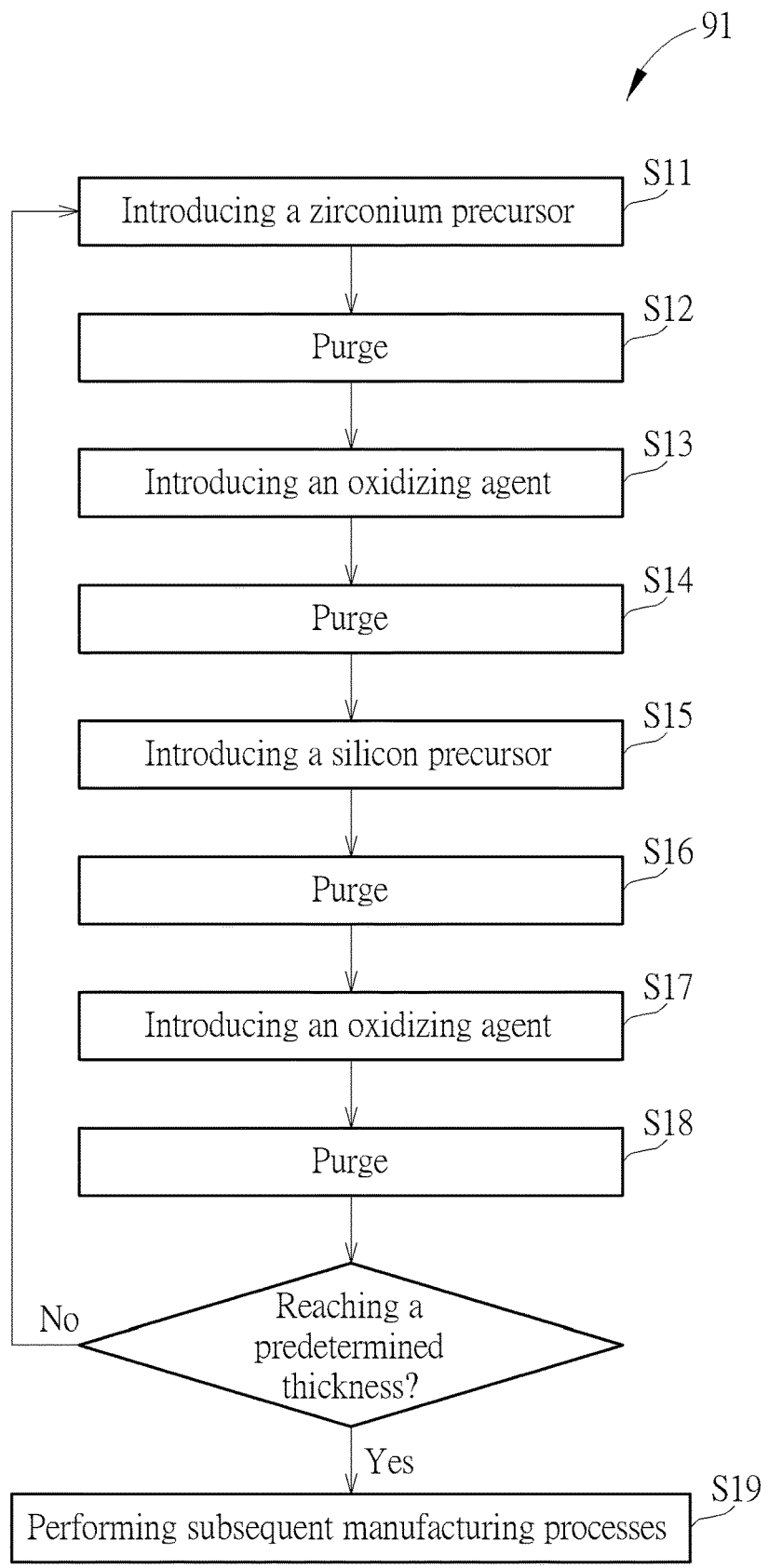
FIG. 2 is a flow chart of an atomic layer deposition process for forming a zirconium silicon oxide layer according to an embodiment of the present invention.
Figure 3:
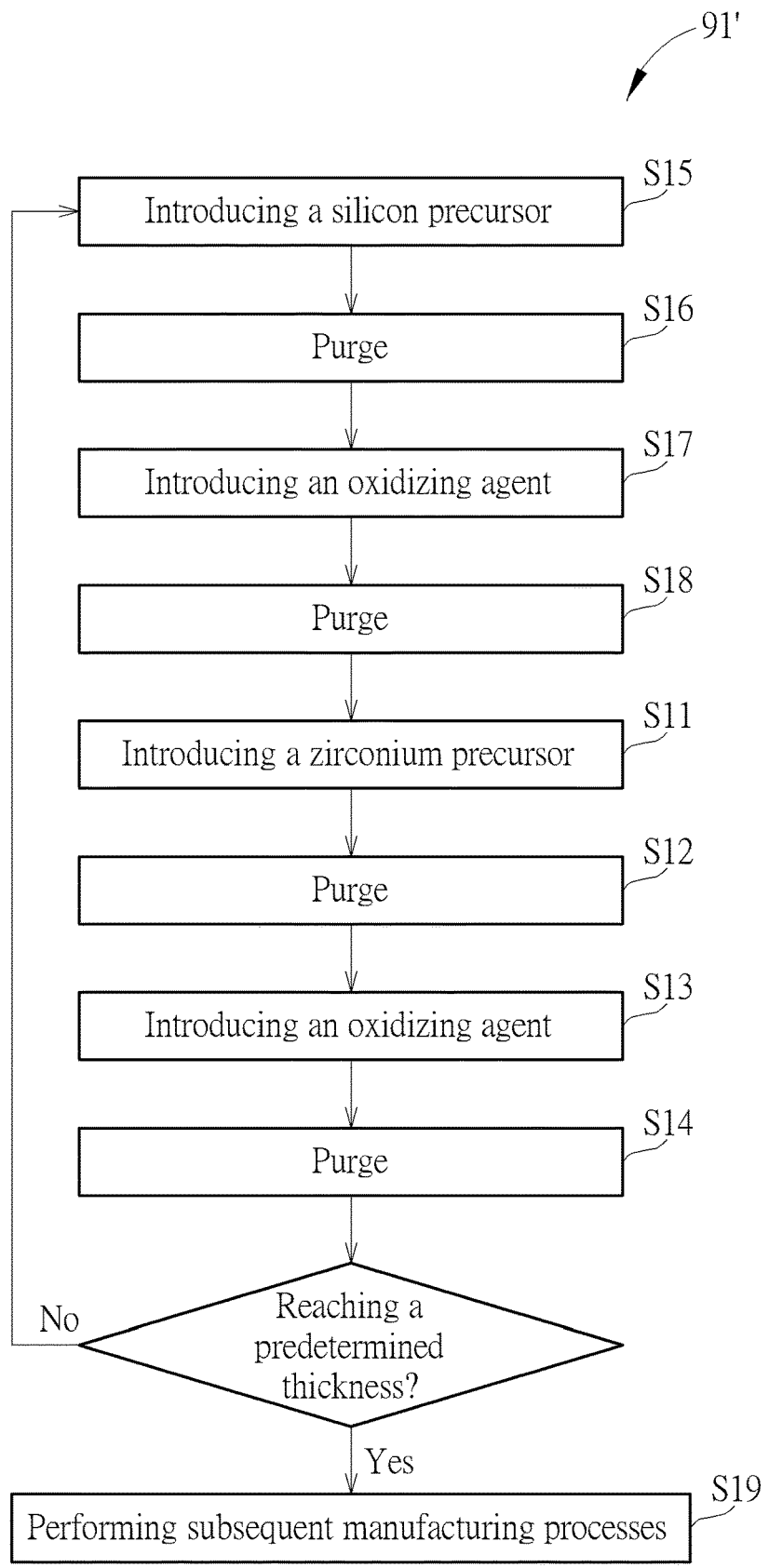
FIG. 3 is a flow chart of an atomic layer deposition process for forming a zirconium silicon oxide layer according to another embodiment of the present invention.
Figure 4:
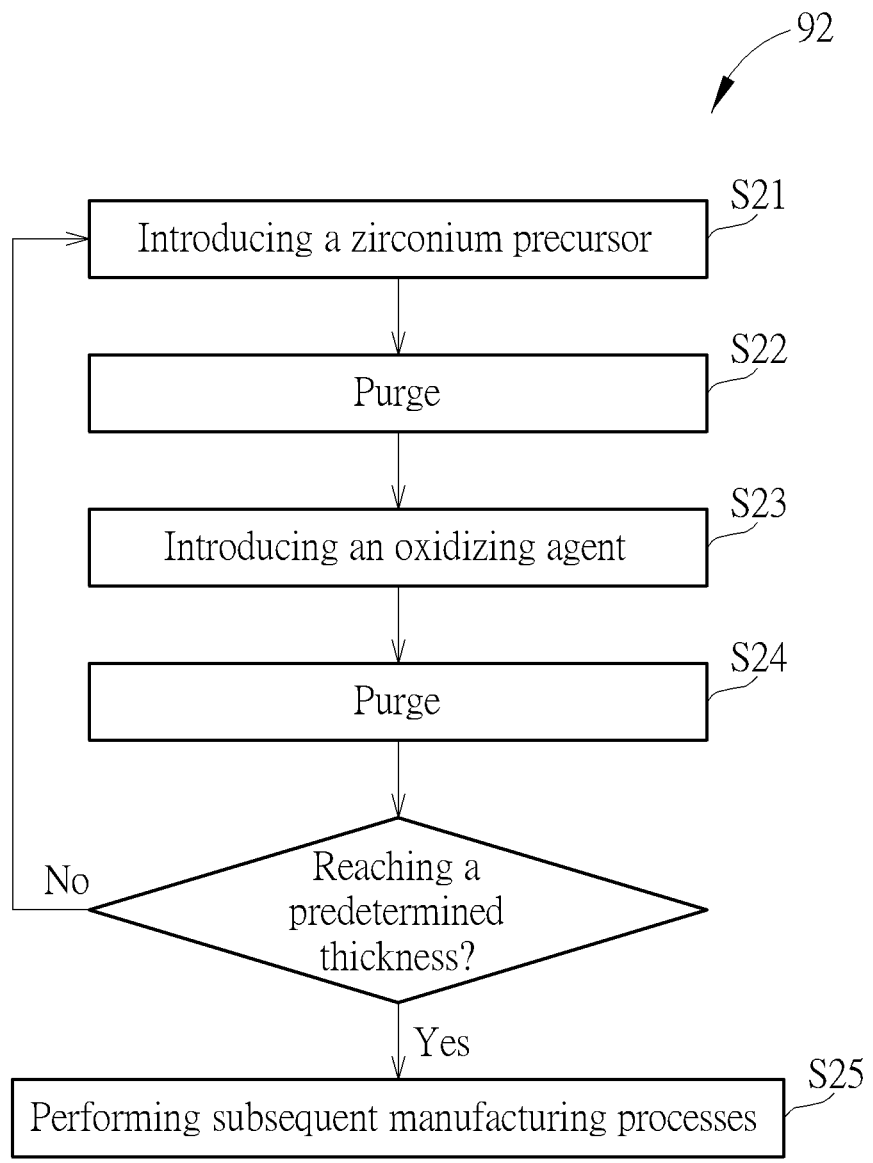
FIG. 4 is a flow chart of an atomic layer deposition process for forming a zirconium oxide layer according to an embodiment of the present invention.

Please refer to FIGS. 1-4. FIG. 2 is a flow chart of an atomic layer deposition process for forming a zirconium silicon oxide layer according to an embodiment of the present invention, FIG. 3 is a flow chart of an atomic layer deposition process for forming a zirconium silicon oxide layer according to another embodiment of the present invention, and FIG. 4 is a flow chart of an atomic layer deposition process for forming a zirconium oxide layer according to an embodiment of the present invention. As shown in FIG. 1, the manufacturing method of the capacitor structure 101 may include the following steps. The capacitor dielectric stacked layer DS is formed on the first electrode 20, and the capacitor dielectric stacked layer DS includes a first dielectric layer (such as the dielectric layer 30 described above). The dielectric layer 30 includes a first zirconium oxide layer (such as the zirconium oxide layer 34 described above) and a first zirconium silicon oxide layer (such as the zirconium silicon oxide layer 32 described above). Subsequently, the second electrode 60 is formed on the capacitor dielectric stacked layer DS, and the capacitor dielectric stacked layer DS is located between the first electrode 20 and the second electrode 60.

In some embodiments, the manufacturing method of the capacitor structure 101 may include but is not limited to the following steps. The first electrode 20 may be formed on the substrate 10, and the first electrode 20 and the second electrode 60 may be formed by sputtering processes, atomic layer deposition (ALD) processes, or other suitable film forming approaches. In some embodiments, the first electrode 20, the second electrode 60, and the material layers in the capacitor dielectric stacked layer DS may be respectively formed on the substrate 10 by corresponding film forming approaches and one or a plurality of patterning processes (such as photolithography processes). In some embodiments, the zirconium silicon oxide layer 32 and the zirconium oxide layer 34 in the dielectric layer 30 may be formed by corresponding atomic layer deposition processes, respectively. For example, the zirconium silicon oxide layer 32 may be formed by an atomic layer deposition process 91 shown in FIG. 2 or an atomic layer deposition process 91' shown in FIG. 3, and the zirconium oxide layer 34 may be formed by an atomic layer deposition process 92 shown in FIG. 4, but not limited thereto.

As shown in FIG. 1 and FIG. 2, in some embodiments, the atomic layer deposition process 91 may include the following steps. Firstly, a step S11 may be performed for introducing a zirconium precursor. In some embodiments, the zirconium precursor may be introduced into a process chamber for the atomic layer deposition process 91, and the substrate 10 with the first electrode 20 formed thereon may be placed in the process chamber before the step S11. The zirconium precursor described above may include zirconium halide, such as zirconium chloride, or other suitable zirconium precursor materials. Subsequently, a step S12 may be performed after the step S11 for carrying out a purge step configured to remove the zirconium precursor and/or other possible reaction byproducts. The zirconium precursor described above may be introduced into the process chamber and kept in the process chamber for a predetermined period (the step S11 may be regarded as a pulse step, for example) so as to make zirconium in the zirconium precursor be adsorbed on a surface of a target (such as the first electrode 20) and form a zirconium atomic monolayer accordingly. The purge step described above may be used to remove the redundant zirconium precursor and/or possible reaction byproducts in the process chamber from the process chamber. A step S13 may be performed after the step S12 for introducing an oxidizing agent. The oxidizing agent may be introduced into the process chamber and kept in the process chamber for a predetermined period so as to bond oxygen atoms to zirconium atoms and form zirconium oxide accordingly. A step S14 may be performed after the step S13 for carrying out a purge configured to remove the oxidizing agent. The purge in the step S14 may be used to remove the redundant oxidizing agent and/or possible reaction byproducts in the process chamber from the process chamber. A step S15 may be performed after the step S14 for introducing a silicon precursor. The silicon precursor may be introduced into the process chamber and kept in the process chamber for a predetermined period so as to make silicon in the silicon precursor be adsorbed on a surface of a target (such as the zirconium oxide formed in the step S13 described above) and form a silicon atomic monolayer accordingly. In some embodiments, the silicon precursor may include silicon halide, such as silicon fluoride, silicon chloride, or other suitable silicon precursor materials. A step S16 may be performed after the step S15 for carrying out a purge configured to remove the silicon precursor. The purge in the step S16 may be used to remove the redundant silicon precursor and/or possible reaction byproducts in the process chamber from the process chamber. A step S17 may be performed after the step S16 for introducing an oxidizing agent. The oxidizing agent may be introduced into the process chamber and kept in the process chamber for a predetermined period so as to bond oxygen atoms to silicon atoms. A step S18 may be performed after the step S17 for carrying out a purge configured to remove the oxidizing agent and/or possible reaction byproducts in the process chamber from the process chamber.

The purge using inert gases and/or other suitable approaches may be applied in the step S12, the step S14, the step S16, and the step S18 described above for achieving the purpose of removing the precursors, the oxidizing agents, and/or the reaction byproducts. In addition, the oxidizing agents used in the step S13 and the step S17 described above may include oxygen, ozone, water vapor, hydrogen peroxide, nitrogen oxide, or other suitable oxidizing agent materials. The material composition of the oxidizing agent used in the step S13 may be identical to or different from the material composition of the oxidizing agent used in the step S17 according to some design considerations. The step S11 to the step S18 described above may be regarded as a cycle in the atomic layer deposition process 91, and the thickness of the zirconium silicon oxide layer (such as the zirconium silicon oxide layer 32) formed by the atomic layer deposition process 91 may be increased by repeating the cycle (i.e. repeating the step S11 to the step S18). In other words, the zirconium silicon oxide layer 32 may include zirconium atomic monolayers, oxygen atomic monolayers, and silicon atomic monolayers alternately stacked and disposed in the vertical direction Z. In addition, the number of the cycles required to be performed may be calculated with the thickness design value of the zirconium silicon oxide layer 32. If the expected thickness calculated with the number of the cycles performed after the step S18 does not reached the predetermined thickness, the cycle described above has to be performed again, and if the expected thickness calculated with the number of cycles performed after the step S18 reaches the predetermined thickness, then a step S19 can be carried out for performing subsequent manufacturing processes. In some embodiments, the steps in the cycle described above may be adjusted according to the silicon atomic percentage designed in the zirconium silicon oxide layer to be formed. For example, the steps S15 to the step S18 in some of the cycles repeated may be removed for lowering the atomic percentage of silicon in the zirconium silicon oxide layer, but not limited thereto. In other words, the atomic percentage of zirconium in the zirconium silicon oxide layer may be equal to or different from the atomic percentage of silicon in the zirconium silicon oxide layer. In some embodiments, the cycle (i.e. the step S11 to the step S18) described above may be repeated at least three times, and an end step may be the step S14 for forming the zirconium silicon oxide layer including zirconium oxide monolayer structures at two opposite ends of the zirconium silicon oxide layer in the vertical direction Z, respectively, but not limited thereto.

As shown in FIG. 1 and FIG. 3, in some embodiments, the atomic layer deposition process 91' may include the following steps. Firstly, the step S15 may be performed for introducing the silicon precursor. The step S16 may be performed after the step S15 for carrying out the purge configured to remove the silicon precursor and/or possible reaction byproducts. The step S17 may be performed after the step S16 for introducing the oxidizing agent so as to bond oxygen atoms to silicon atoms. The step S18 may be performed after the step S17 for carrying out the purge configured to remove the oxidizing agent and/or possible reaction byproducts. The step S11 may be performed after the step S18 for introducing the zirconium precursor. The step S12 may be performed after the step S11 for carrying out the purge configured to remove the zirconium precursor and/or other possible reaction byproducts. The step S13 may be performed after the step S12 for introducing the oxidizing agent so as to bond oxygen atoms to zirconium atoms and form zirconium oxide accordingly. The step S14 may be performed after the step S13 for carrying out the purge configured to remove the oxidizing agent and/or possible reaction byproducts.

The step S15, the step S16, the step S17, the step S18, the step S11, the step S12, the step S13, and the step S14 described above may be regarded as a cycle in the atomic layer deposition process 91', and the thickness of the zirconium silicon oxide layer (such as the zirconium silicon oxide layer 32) formed by the atomic layer deposition process 91' may be increased by repeating the cycle. If the expected thickness calculated with the number of the cycles performed after the step S14 does not reached the predetermined thickness, the cycle described above has to be performed again, and if the expected thickness calculated with the number of cycles performed after the step S14 reaches the predetermined thickness, then the step S19 can be carried out for performing subsequent manufacturing processes. In some embodiments, the cycle (i.e. the step S15, the step S16, the step S17, the step S18, the step S11, the step S12, the step S13, and the step S14) described above may be repeated at least three times, and an end step may be the step S18 for forming the zirconium silicon oxide layer including silicon oxide monolayer structures at two opposite ends of the zirconium silicon oxide layer in the vertical direction Z, respectively, but not limited thereto.

In other words, the difference between the atomic layer deposition process 91' and the atomic layer deposition process 91 shown in FIG. 2 is that the step S11 to the step S14 are performed firstly in the atomic layer deposition process 91 for forming the zirconium oxide first, and the step S15 to the step S18 are performed firstly in the atomic layer deposition process 91' for forming the silicon oxide first.

As shown in FIG. 1 and FIG. 4, in some embodiments, the atomic layer deposition process 92 may include the following steps. Firstly, a step S21 may be performed for introducing a zirconium precursor. The zirconium precursor may be introduced into a process chamber for the atomic layer deposition process 92. In some embodiments, different atomic layer deposition processes may be carried out sequentially in the same process chamber. For example, the atomic layer deposition process 92 may be carried out directly in the same process chamber after the atomic layer deposition process 91 shown in FIG. 2 or the atomic layer deposition process 91' shown in FIG. 3 for avoiding the influence of the external environment, but not limited thereto. In some embodiments, the different atomic layer deposition processes described above may also be performed respectively in different process chambers within the same process apparatus according to some design considerations. Subsequently, a step S22 may be performed after the step S21 for carrying out a purge step configured to remove the zirconium precursor and/or other possible reaction byproducts. In the step S21, zirconium in the zirconium precursor may be adsorbed on a surface of a target (such as the zirconium silicon oxide layer 32) and form a zirconium atomic monolayer accordingly. The purge step described above may be used to remove the redundant zirconium precursor and/or possible reaction byproducts in the process chamber from the process chamber. A step S23 may be performed after the step S22 for introducing an oxidizing agent. The oxidizing agent may be introduced into the process chamber and kept in the process chamber for a predetermined period so as to bond oxygen atoms to zirconium atoms and form zirconium oxide accordingly. A step S24 may be performed after the step S23 for carrying out a purge configured to remove the redundant oxidizing agent and/or possible reaction byproducts in the process chamber from the process chamber. In some embodiments, the process conditions of the step S21 to the step S24 may be identical to or similar to the process conditions of the step S11 to the step S14 shown in FIG. 2 described above.

In some embodiments, the step S21 to the step S24 described above may be regarded as a cycle in the atomic layer deposition process 92, and the thickness of the zirconium oxide layer (such as the zirconium oxide layer 34)

formed by the atomic layer deposition process 92 may be increased by repeating the cycle (i.e. repeating the step S21 to the step S24). In other words, the zirconium oxide layer 34 may include zirconium atomic monolayers and oxygen atomic monolayers alternately stacked and disposed in the vertical direction Z. In addition, the number of the cycles required to be performed may be calculated with the thickness design value of the zirconium oxide layer 34. If the expected thickness calculated with the number of the cycles performed after the step S24 does not reached the predetermined thickness, the cycle described above has to be performed again, and if the expected thickness calculated with the number of cycles performed after the step S24 reaches the predetermined thickness, then a step S25 can be carried out for performing subsequent manufacturing processes. As shown in FIG. 1, in some embodiments, the capacitor dielectric stacked layer DS may further include the aluminum oxide layer 40 and the dielectric layer 50, and the dielectric layer 50 may include the zirconium oxide layer 54. The aluminum oxide layer 40 and the zirconium oxide layer 54 may be formed by corresponding atomic layer deposition processes, respectively. For example, the aluminum oxide layer 40 may be formed on the dielectric layer 30 by an atomic layer deposition process, and the zirconium oxide layer 54 may be formed on the aluminum oxide layer 40 by the atomic layer deposition process 92 shown in FIG. 4, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
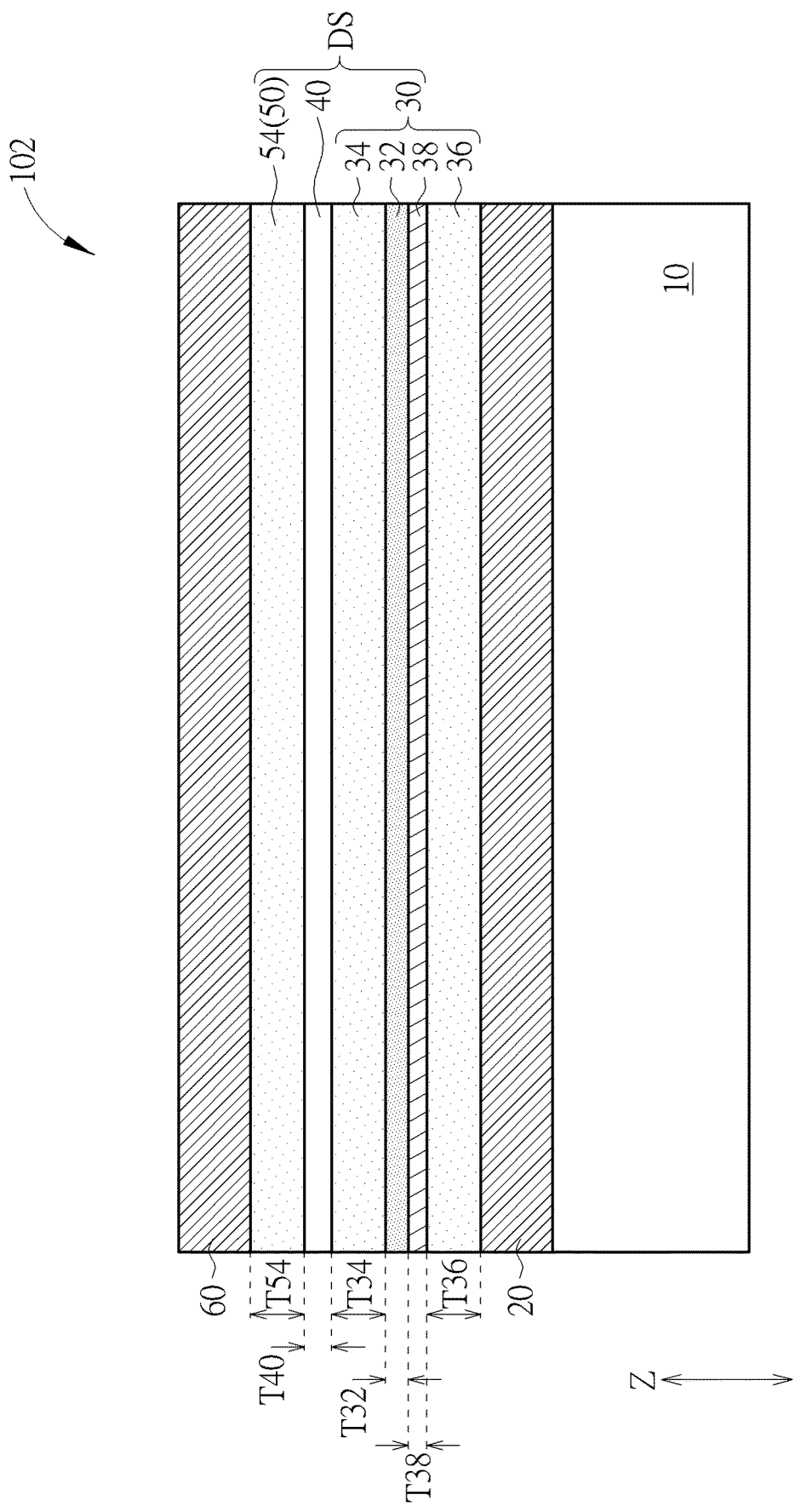
FIG. 5 is a schematic drawing illustrating a capacitor structure according to a second embodiment of the present invention.

Please refer to FIG. 5. FIG. 5 is a schematic drawing illustrating a capacitor structure 102 according to a second embodiment of the present invention. As shown in FIG. 5, in the capacitor structure 102, the dielectric layer 30 may further include a third zirconium oxide layer (such as a zirconium oxide layer 36 illustrated in FIG. 5) and a silicon oxide layer 38. The zirconium silicon oxide layer 32 may be disposed between the zirconium oxide layer 34 and the zirconium oxide layer 36 in the vertical direction Z, and the silicon oxide layer 38 may be disposed between the zirconium oxide layer 34 and the zirconium oxide layer 36 in the vertical direction Z also. In some embodiments, the silicon oxide layer 38 may be used to reduce the leakage current generated by the crystallization of the zirconium oxide layer 34, but the dielectric constant of the silicon oxide layer 38 is relatively lower (such as being lower than the dielectric constant of the zirconium oxide layer 34, the dielectric constant of the zirconium oxide layer 36, and the dielectric constant of the zirconium silicon oxide layer 32, respectively). Therefore, a thickness T38 of the silicon oxide layer 38 in the vertical direction Z may be less than a thickness T36 of the zirconium oxide layer 36 in the vertical direction Z and/or the thickness T34 of the zirconium oxide layer 34 in the vertical direction Z for reducing the influence of the silicon oxide layer 38 on the permittivity and/or the capacitance density of the capacitor dielectric stacked layer DS. Additionally, in some embodiments, the zirconium oxide layer 36 and the silicon oxide layer 38 may be formed by corresponding atomic layer deposition processes, respectively. For example, the zirconium oxide layer 36 may be formed by the atomic layer deposition process 92 shown in FIG. 2, and the silicon oxide layer 38 may be formed by an atomic layer deposition process 93 shown in FIG. 6, but not limited thereto.

Figure 6:
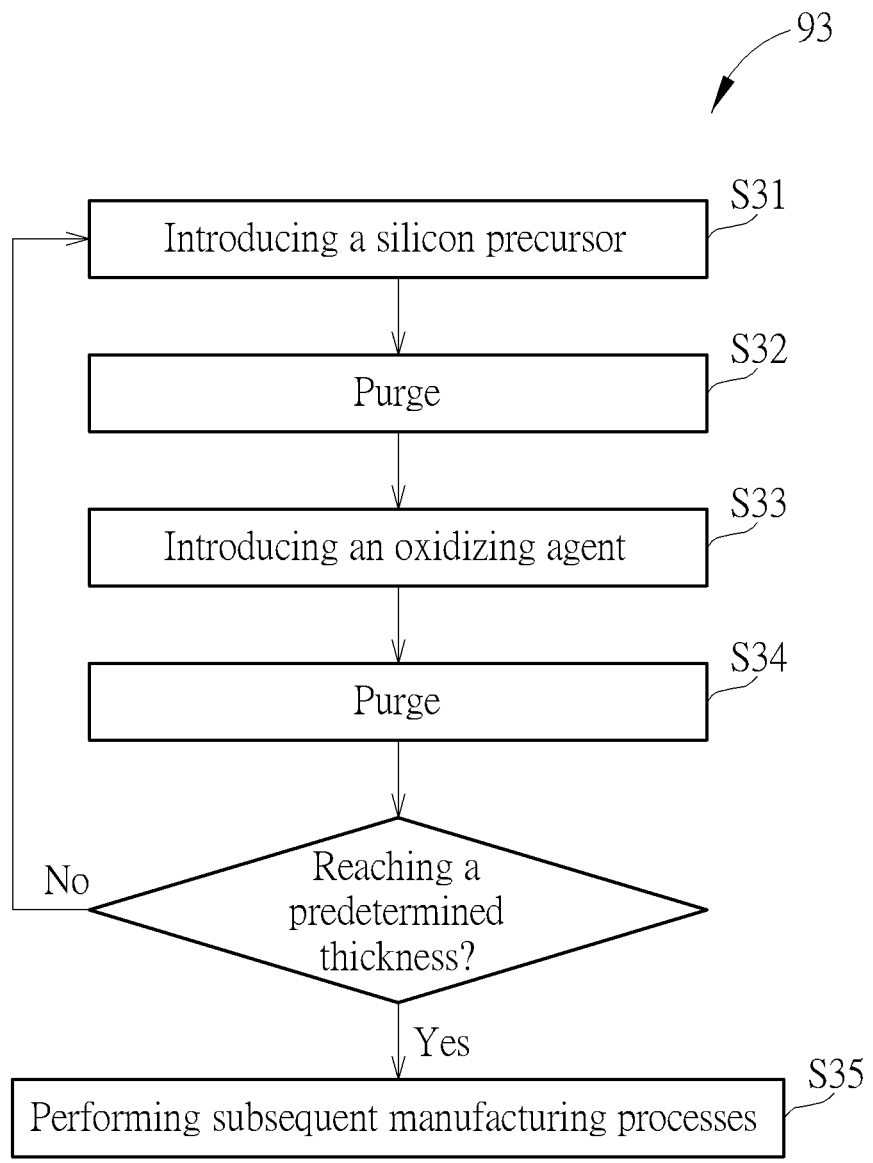
FIG. 6 is a flow chart of an atomic layer deposition process for forming a silicon oxide layer according to an embodiment of the present invention.

As shown in FIG. 5 and FIG. 6, in some embodiments, the atomic layer deposition process 93 may include the following steps. Firstly, a step S31 may be performed for introducing a silicon precursor. The silicon precursor may be introduced into a process chamber for the atomic layer deposition process 93. In some embodiments, different atomic layer deposition processes may be carried out sequentially in the same process chamber. For example, the atomic layer deposition process 93 may be carried out directly in the same process chamber after the atomic layer deposition process of forming the zirconium oxide layer 36, but not limited thereto. Subsequently, a step S32 may be performed after the step S31 for carrying out a purge step configured to remove the silicon precursor and/or possible reaction byproducts. In the step S31, silicon in the silicon precursor may be adsorbed on a surface of a target (such as the zirconium oxide layer 36) and form a silicon atomic monolayer accordingly. The purge step described above may be used to remove redundant silicon precursor and/or possible reaction byproducts in the process chamber from the process chamber. A step S33 may be performed after the step S32 for introducing an oxidizing agent. The oxidizing agent may be introduced into the process chamber and kept in the process chamber for a predetermined period so as to bond oxygen atoms to silicon atoms and form silicon oxide. A step S34 may be performed after the step S33 for carrying out a purge configured to remove redundant oxidizing agent and/or possible reaction byproducts in the process chamber from the process chamber. In some embodiments, the process conditions of the step S31 to the step S34 may be identical to or similar to the process conditions of the step S15 to the step S18 shown in FIG. 2 described above.

In some embodiments, the step S31 to the step S34 described above may be regarded as a cycle in the atomic layer deposition process 93, and the thickness of the silicon oxide layer (such as the silicon oxide layer 38) formed by the atomic layer deposition process 93 may be increased by repeating the cycle (i.e. repeating the step S31 to the step S34). In other words, the silicon oxide layer 38 may include silicon atomic monolayers and oxygen atomic monolayers alternately stacked and disposed in the vertical direction Z. In addition, the number of the cycles required to be performed may be calculated with the design thickness of the silicon oxide layer 38. If the expected thickness calculated with the number of cycles performed after the step S34 does not reached the predetermined thickness, the cycle described above has to be performed again, and if the expected thickness calculated with the number of cycles performed after the step S34 reaches the predetermined thickness, then a step S35 can be carried out for performing subsequent manufacturing processes (such as a manufacturing process for forming the zirconium silicon oxide layer 32).

Figure 7:
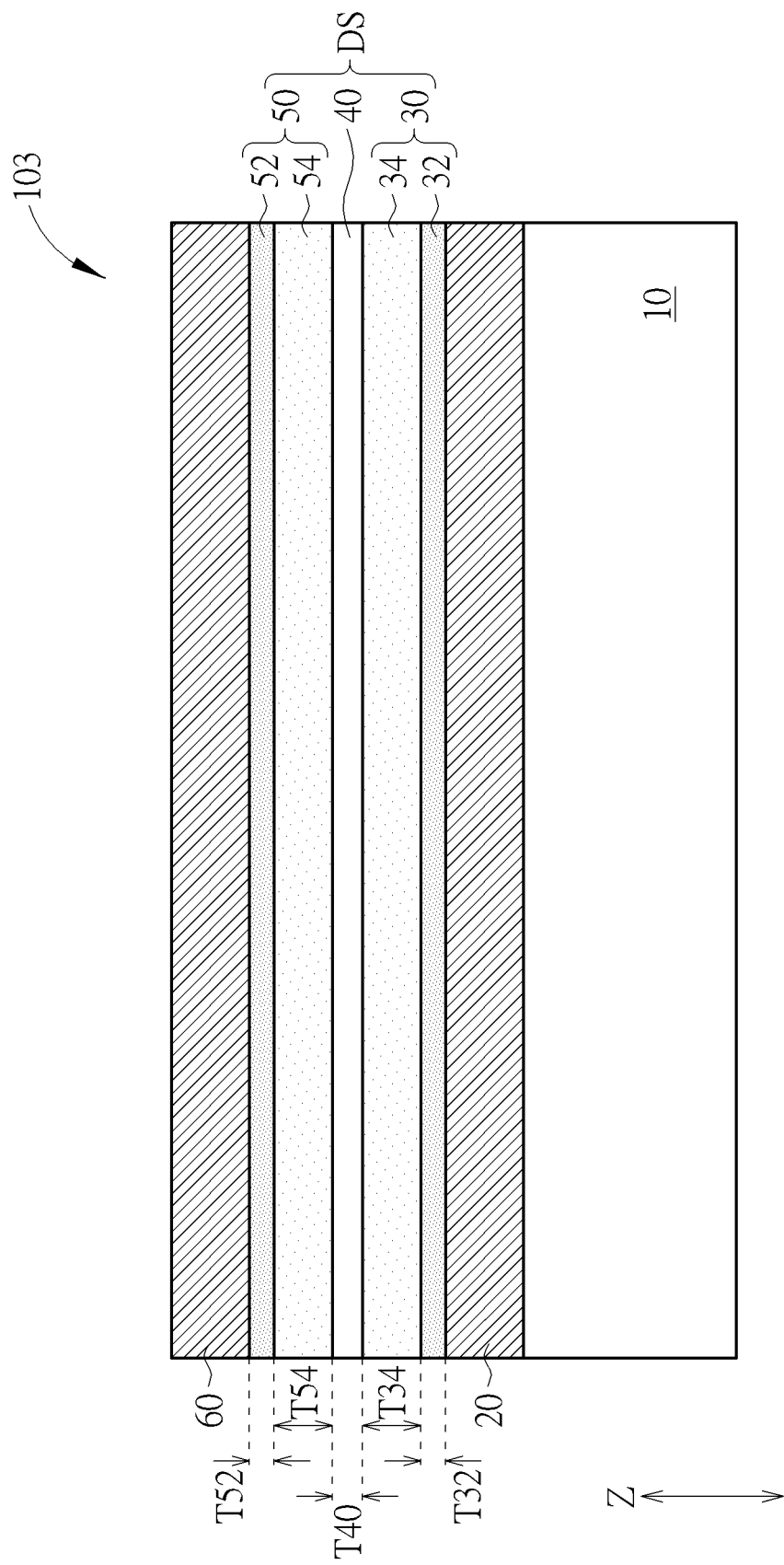
FIG. 7 is a schematic drawing illustrating a capacitor structure according to a third embodiment of the present invention.

Please refer to FIG. 7. FIG. 7 is a schematic drawing illustrating a capacitor structure 103 according to a third embodiment of the present invention. As shown in FIG. 7, in the capacitor structure 103, the dielectric layer 50 may further include a second zirconium silicon oxide layer (such as a zirconium silicon oxide layer 52), and the zirconium silicon oxide layer 52 and the zirconium oxide layer 54 in the dielectric layer 50 may be stacked and disposed in the vertical direction Z. In some embodiments, the zirconium silicon oxide layer 52 may be disposed between the second electrode 60 and the zirconium oxide layer 54, and the zirconium silicon oxide layer 32 may be disposed between the first electrode 20 and the zirconium oxide layer 34. Therefore, the zirconium silicon oxide layer 52 and the zirconium silicon oxide layer 32 may be located at two opposite ends of the capacitor dielectric stacked layer DS in the vertical direction Z, respectively, but not limited thereto. In some embodiments, the zirconium oxide layer 54 may be pure zirconium oxide (such as consisting of zirconium oxide only) or be nearly pure zirconium oxide. Therefore, an atomic percentage of zirconium in the zirconium oxide layer 54 may be higher than an atomic percentage of zirconium in the zirconium silicon oxide layer 52, and a thickness T52 of the zirconium silicon oxide layer 52 in the vertical direction Z may be less than the thickness T54 of the zirconium oxide layer 54 in the vertical direction Z, but not limited thereto. In some embodiments, the zirconium oxide layer 54 and the zirconium silicon oxide layer 52 may be formed by corresponding atomic layer deposition processes, respectively. For example, the zirconium oxide layer 54 may be formed on the aluminum oxide layer 40 by the atomic layer deposition process 92 shown in FIG. 4, and the zirconium silicon oxide layer 52 may be formed on the zirconium oxide layer 54 by the atomic layer deposition process 91 shown in FIG. 2 the an atomic layer deposition process 91' shown in FIG. 3, but not limited thereto.

Figure 8:
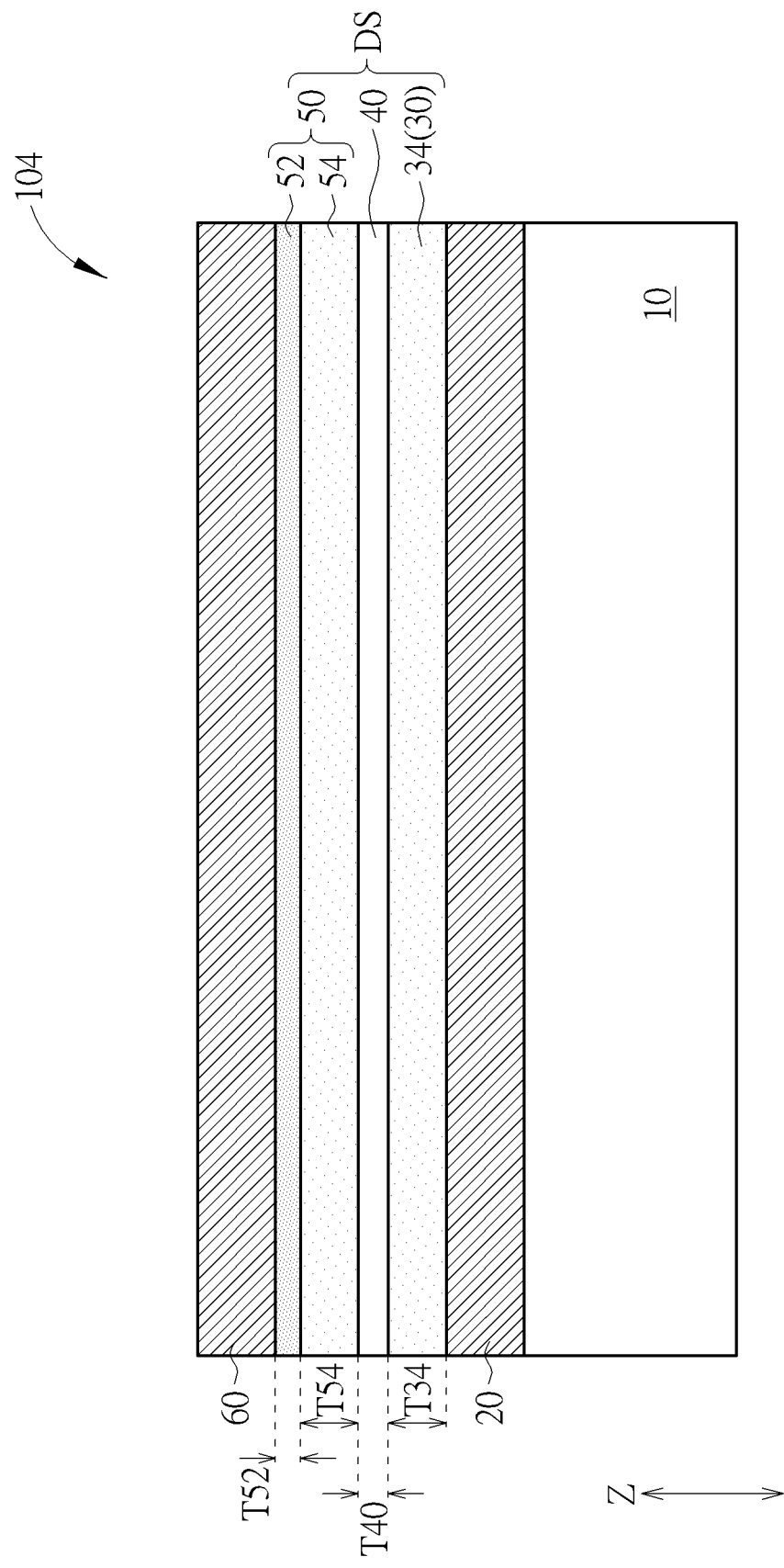
FIG. 8 is a schematic drawing illustrating a capacitor structure according to a fourth embodiment of the present invention.
Figure 9:
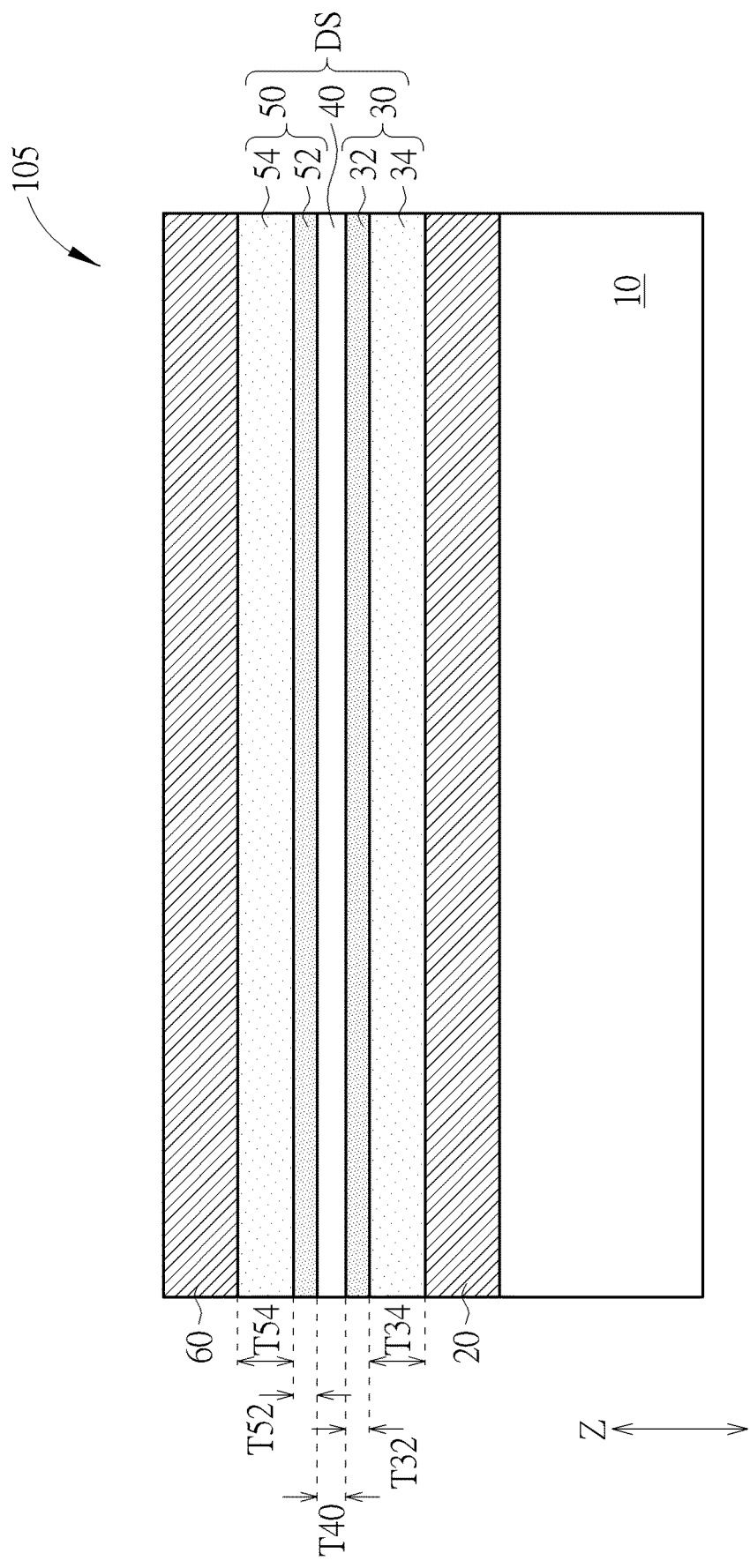
FIG. 9 is a schematic drawing illustrating a capacitor structure according to a fifth embodiment of the present invention.

Please refer to FIG. 8. FIG. 8 is a schematic drawing illustrating a capacitor structure 104 according to a fourth embodiment of the present invention. As shown in FIG. 8, in the capacitor structure 104, the dielectric layer 30 may include the zirconium oxide layer 34 only, and the zirconium silicon oxide layer 52 in the capacitor dielectric stacked layer DS may be located at a side adjacent to the second electrode 60. Please refer to FIG. 9. FIG. 9 is a schematic drawing illustrating a capacitor structure 105 according to a fifth embodiment of the present invention. As shown in FIG. 9, in the capacitor structure 105, the zirconium silicon oxide layer 32 may be disposed between the zirconium oxide layer 34 and the aluminum oxide layer 40, and the zirconium silicon oxide layer 52 may be disposed between the zirconium oxide layer 54 and the aluminum oxide layer 40. Therefore, the zirconium silicon oxide layer 52 and the zirconium silicon oxide layer 32 may be located at two opposite ends of the aluminum oxide layer 40 in the vertical direction Z, respectively, and directly connected with the aluminum oxide layer 40, but not limited thereto. In other words, the position of each zirconium silicon oxide layers in the capacitor dielectric stacked layer DS may be adjusted according to some design considerations (such as the approach for applying voltages respectively to the first electrode 20 and the second electrode 60 during operation and/or the mechanism of transmitting electrons in the capacitor structure).

Figure 10:
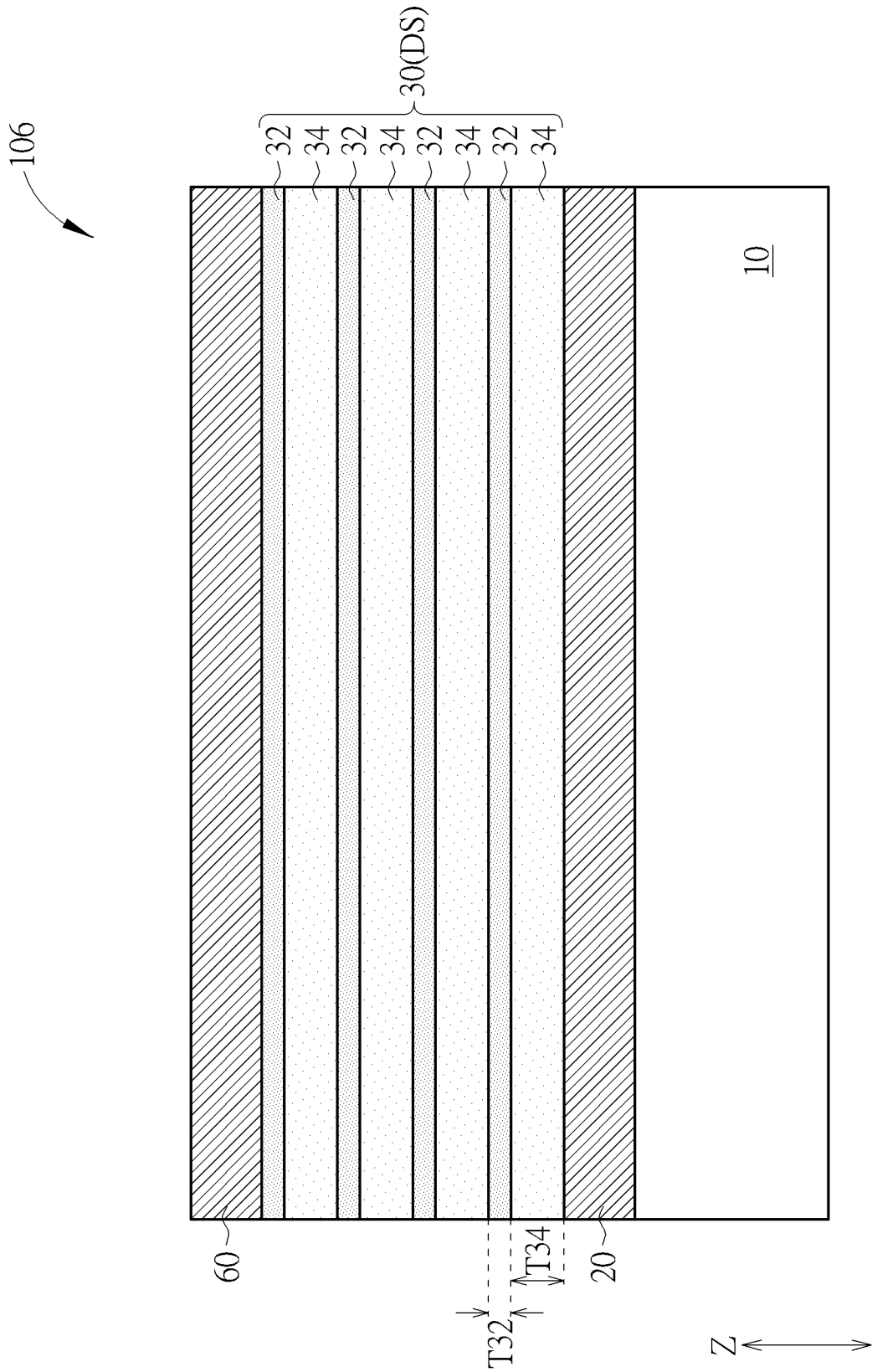
FIG. 10 is a schematic drawing illustrating a capacitor structure according to a sixth embodiment of the present invention.
Figure 11:
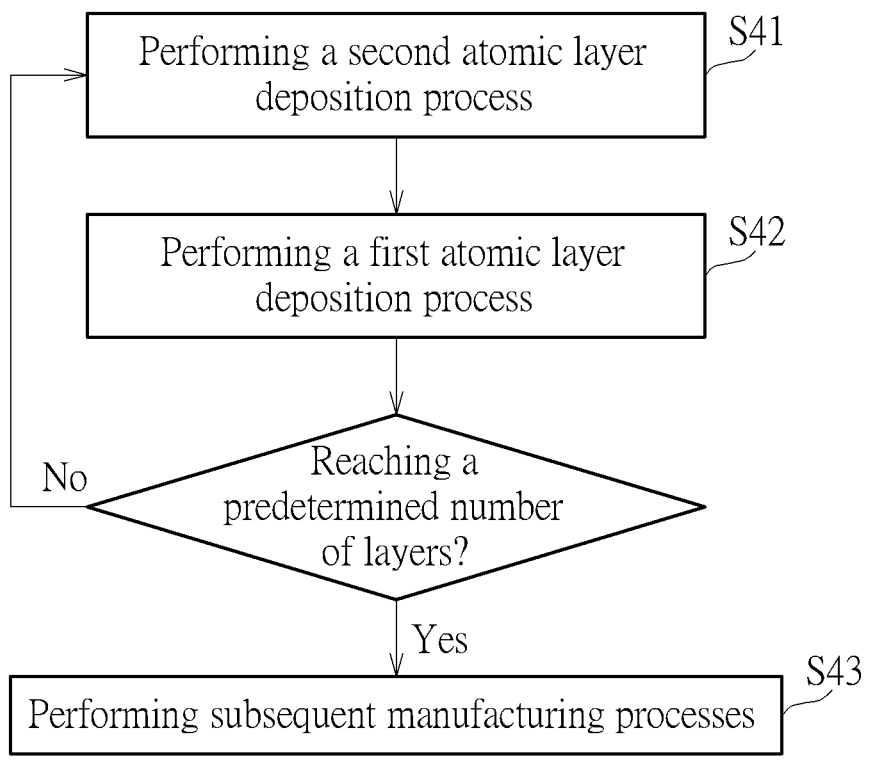
FIG. 11 is a flow chart of a process for forming a capacitor dielectric stacked layer according to an embodiment of the present invention.

Please refer to FIG. 10 and FIG. 11. FIG. 10 is a schematic drawing illustrating a capacitor structure 106 according to a sixth embodiment of the present invention, and FIG. 11 is a flow chart of a process for forming a capacitor dielectric stacked layer according to an embodiment of the present invention. As shown in FIG. 10, in the capacitor structure 106, the dielectric layer 30 may include a plurality of the zirconium oxide layers 34 and a plurality of the zirconium silicon oxide layers 32 alternately stacked and disposed, and there may be not any aluminum oxide layer, which is described in the embodiments above, disposed in the capacitor dielectric stacked layer DS. Additionally, in some embodiments, each of the zirconium oxide layers 34 and each of the zirconium silicon oxide layers 32 in the dielectric layer 30 may be formed by corresponding atomic layer deposition processes, respectively. For example, as shown in FIG. 10 and FIG. 11, the process for forming the capacitor dielectric stacked layer DS in this embodiment may include the following steps. A step S41 may be carried out for performing a second atomic layer deposition process (such as the atomic layer deposition process 92 shown in FIG. 4 described above), so as to form the zirconium oxide layer 34 on the first electrode 20. Subsequently, a step S42 may be carried out for performing a first atomic layer deposition process (such as the atomic layer deposition process 91 shown in FIG. 2 described above or the atomic layer deposition process 91' shown in FIG. 3 described above), so as to form the zirconium silicon oxide layer 32 on the zirconium oxide layer 34.

In some embodiments, the step S41 and the step S42 described above may be regarded as a cycle in the atomic layer deposition process for forming the capacitor dielectric stacked layer DS including the zirconium oxide layers 34 and the zirconium silicon oxide layers 32 alternately stacked and disposed, and the number of the zirconium oxide layers 34 and the zirconium silicon oxide layers 32 may be increased by repeating this cycle. Therefore, the number of the cycles required to be performed may be calculated with the designed number of the zirconium oxide layers 34 and the zirconium silicon oxide layers 32 in the capacitor dielectric stacked layer DS. If the expected number of the layers calculated with the number of the cycles performed after the step S42 does not reached the predetermined number of the layers, the cycle described above has to be performed again, and if the expected number of the layers calculated with the number of cycles performed after the step S42 reaches the predetermined number of the layers, then a step S43 can be carried out for performing subsequent manufacturing processes (such as a manufacturing process for forming the second electrode 20). In other words, the process of forming the dielectric layer 30 in this embodiment may include different atomic layer deposition processes (such as the atomic layer deposition process 92 shown in FIG. 4 and the atomic layer deposition process 91 shown in FIG. 2 or the atomic layer deposition process 91' shown in FIG. 3) performed alternately and repeatedly for forming the dielectric layer 30 including the zirconium oxide layers 34 and the zirconium silicon oxide layers 32 alternately stacked and disposed.

Figure 12:
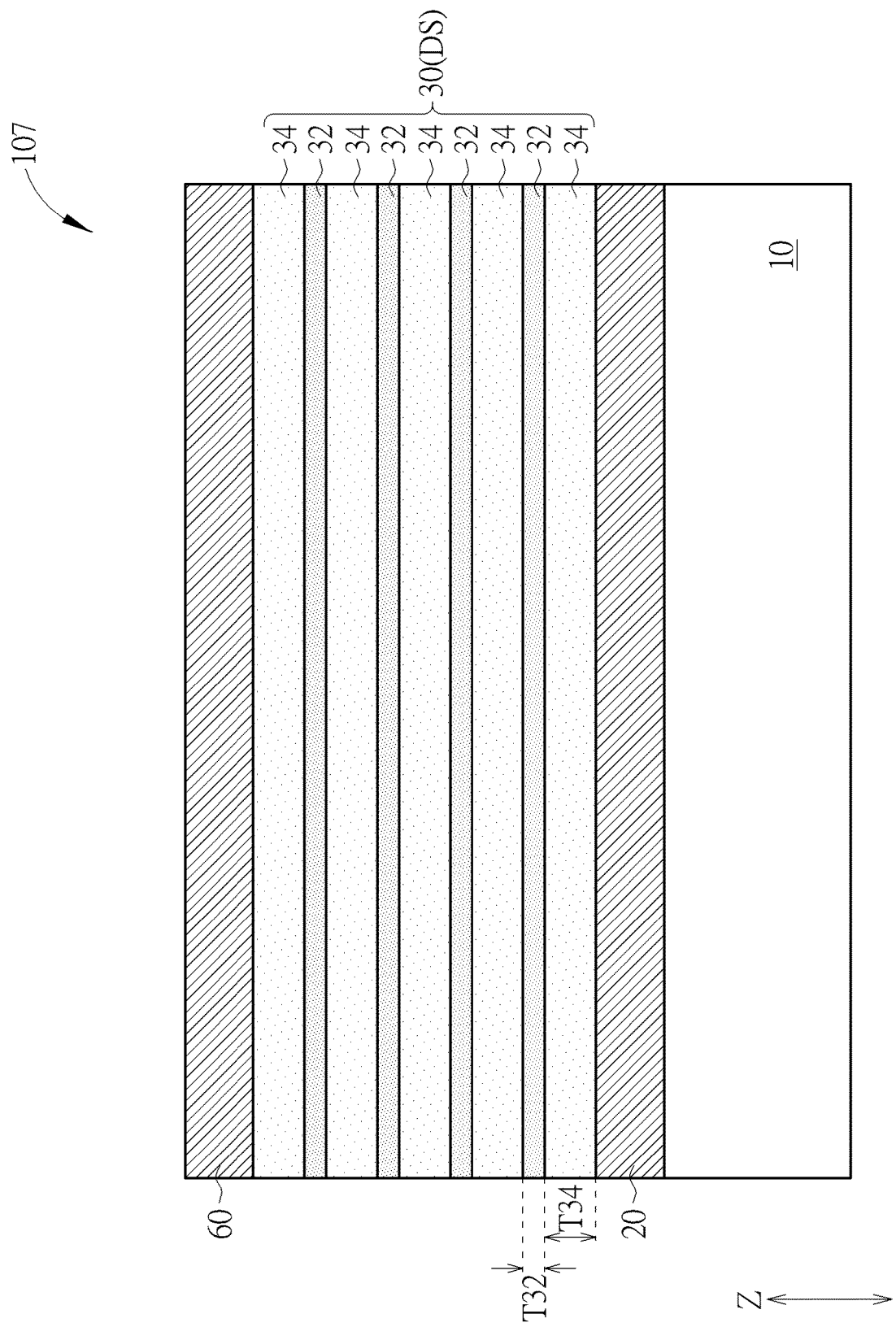
FIG. 12 is a schematic drawing illustrating a capacitor structure according to a seventh embodiment of the present invention.
Figure 13:
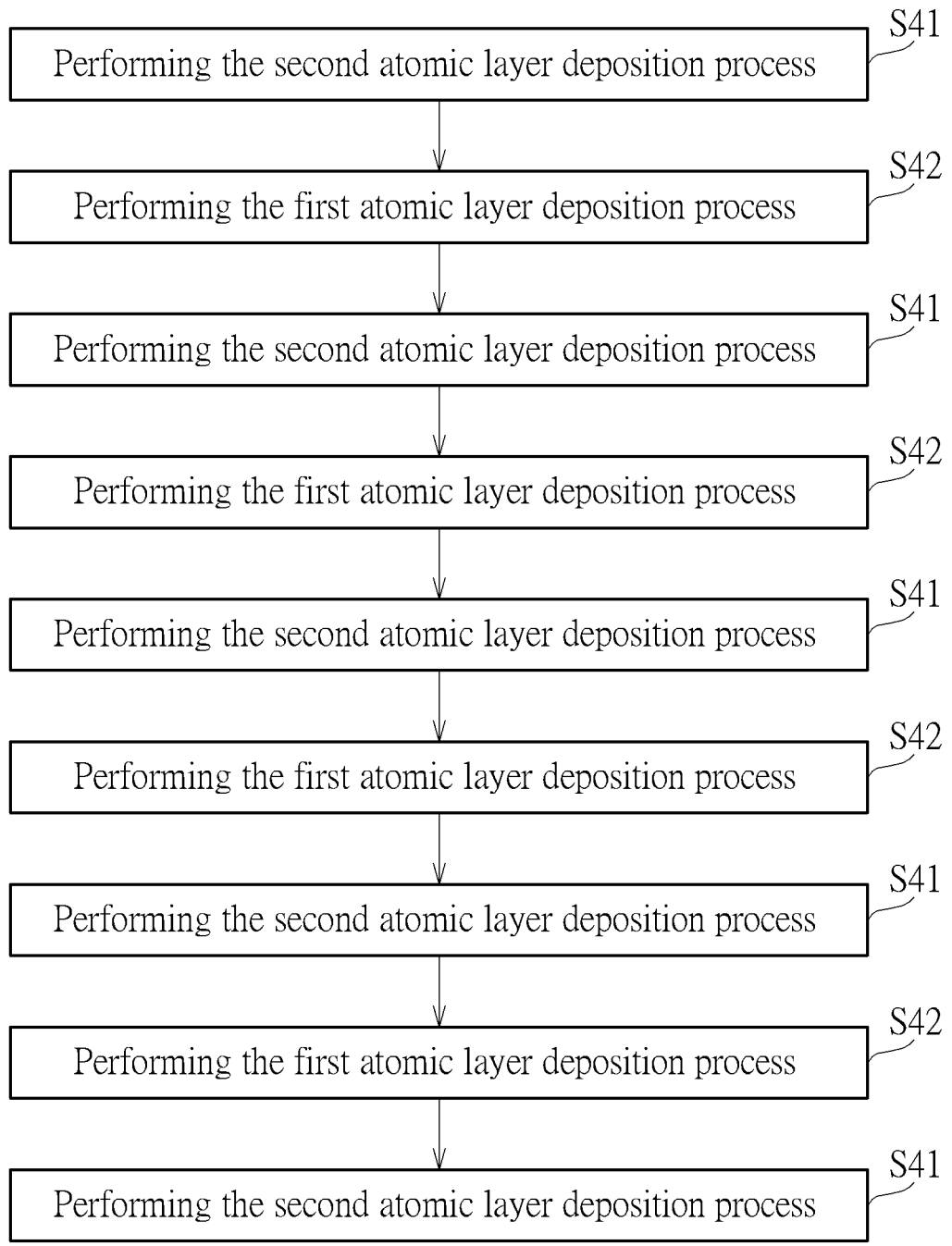
FIG. 13 is a flow chart of a process for forming a capacitor dielectric stacked layer according to another embodiment of the present invention.

Please refer to FIG. 12 and FIG. 13. FIG. 12 is a schematic drawing illustrating a capacitor structure 107 according to a seventh embodiment of the present invention, and FIG. 13 is a flow chart of a process for forming a capacitor dielectric stacked layer according to another embodiment of the present invention. As shown in FIG. 12, in the capacitor structure 107, the dielectric layer 30 may include the zirconium oxide layers 34 and the zirconium silicon oxide layers 32 alternately stacked and disposed, and the material layers located at two opposite ends of the capacitor dielectric stacked layer DS in the vertical direction Z may be the same. For example, the two material layers located at two opposite ends of the capacitor dielectric stacked layer DS in the vertical direction Z, respectively, may be the zirconium oxide layers 34 for reducing the ratio of the zirconium silicon oxide layers 32 in the capacitor dielectric stacked layer DS, but not limited thereto. In some embodiments, the capacitor dielectric stacked layer DS may include the zirconium oxide layers 34 and the zirconium silicon oxide layers 32 alternately stacked and disposed, and the two material layers located at two opposite ends of the capacitor dielectric stacked layer DS in the vertical direction Z, respectively, may be the zirconium silicon oxide layers 32 according to some design considerations. As shown in FIG. 12 and FIG. 13, the process for forming the capacitor dielectric stacked layer DS in this embodiment may include performing the step S41 and the step S42 alternately and repeatedly, and the end step may be the same as the initial step (both of them may be the step S41) for forming the capacitor dielectric stacked layer DS with the zirconium oxide layers 34 located at the two opposite ends of the capacitor dielectric stacked layer DS in the vertical direction Z, respectively.

Figure 14:
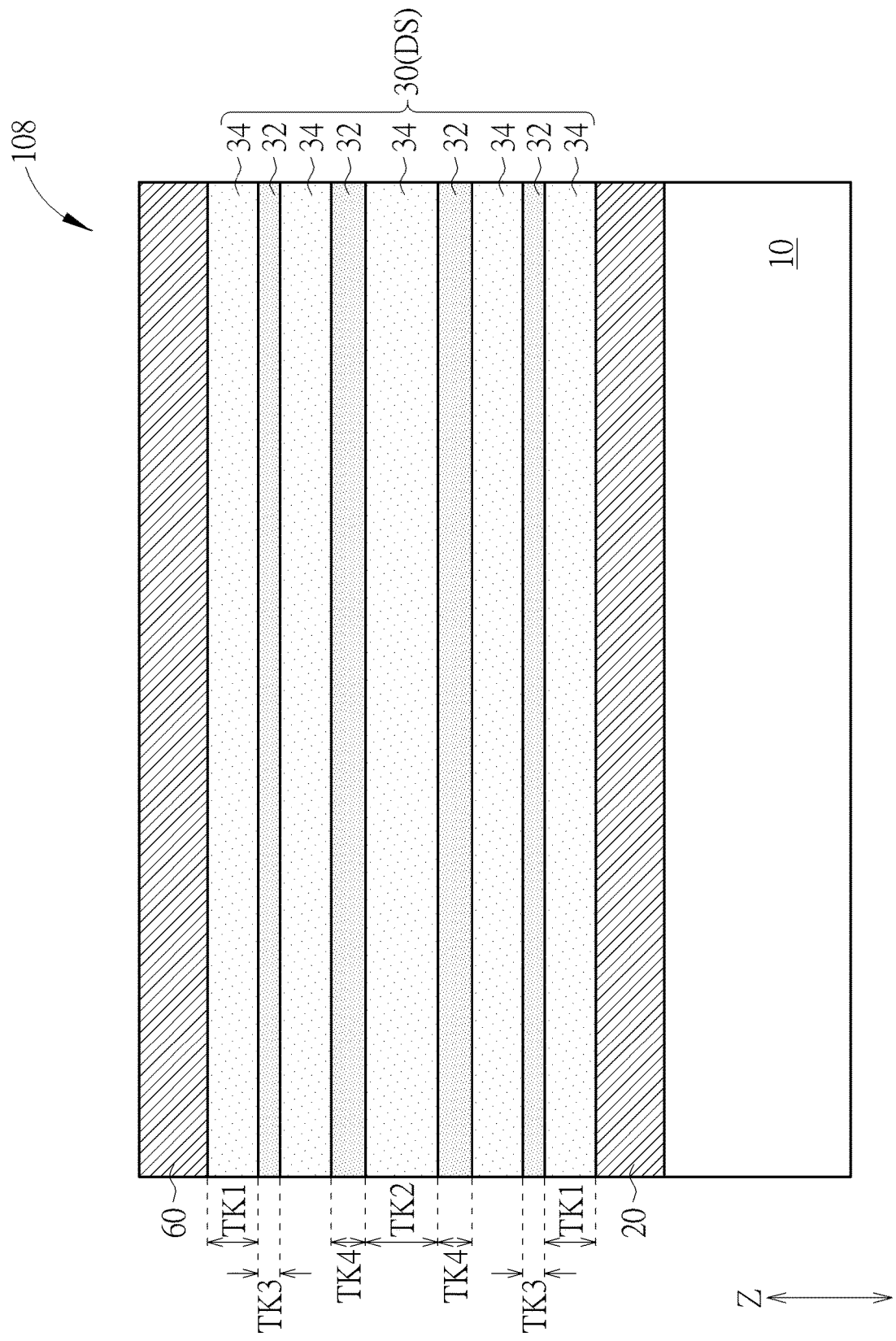
FIG. 14 is a schematic drawing illustrating a capacitor structure according to an eighth embodiment of the present invention.

Please refer to FIG. 14. FIG. 14 is a schematic drawing illustrating a capacitor structure 108 according to an eighth embodiment of the present invention. As shown in FIG. 14, in the capacitor structure 108, the capacitor dielectric stacked layer DS may include the zirconium oxide layers 34 and the zirconium silicon oxide layers 32 alternately stacked and disposed in the vertical direction Z, the thicknesses of at least some of the zirconium oxide layers 34 may be different from each other, and the thicknesses of at least some of the zirconium silicon oxide layers 32 may be different from each other. For example, a thickness TK2 of the zirconium oxide layer 34 located close to the center portion of the capacitor dielectric stacked layer DS in the vertical direction Z may be greater than a thickness TK1 of each of the zirconium oxide layers 34 located at two opposite ends of the capacitor dielectric stacked layer DS in the vertical direction Z, and a thickness TK4 of the zirconium silicon oxide layer 32 located close to the center portion of the capacitor dielectric stacked layer DS in the vertical direction Z may be greater than a thickness TK3 of each of the zirconium silicon oxide layers 32 located close to the two opposite ends of the capacitor dielectric stacked layer DS in the vertical direction Z for adjusting the electric field distribution in the capacitor dielectric stacked layer DS during the operation of the capacitor structure 108, but not limited thereto. In some embodiments, the relative relation between the thicknesses of the zirconium oxide layers 34 and/or the relative relation between the thicknesses of the zirconium silicon oxide layers 32 in the capacitor dielectric stacked layer DS may be different from the condition described above according to some design considerations. In addition, the zirconium oxide layers 34 with different thicknesses and/or the zirconium silicon oxide layers 32 with different thicknesses described above may be formed by adjusting the number of the cycles performed in the corresponding atomic layer deposition processes. For instance, the number of the cycles (such as the number of times to repeat the step S21 to the step S24 shown in FIG. 4) performed in the atomic layer deposition process for forming the relatively thicker zirconium oxide layer 34 may be relatively more, and the number of the cycles (such as the number of times to repeat the step S11 to the step S18 shown in FIG. 2 or the number of times to repeat the step S15 to the step S18 and the step S11 to the step S14 shown in FIG. 3) performed in the atomic layer deposition process for forming the relatively thicker zirconium silicon oxide layer 32 may be relatively more also, but not limited thereto.

To summarize the above descriptions, in the capacitor structure and the manufacturing method thereof according to the present invention, the capacitor dielectric stacked layer including the zirconium oxide layer and the zirconium silicon oxide layer may be disposed between two electrodes of the capacitor structure. The leakage current of the capacitor structure may be reduced by the zirconium silicon oxide layer, and the operating performance of the capacitor structure may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a capacitor structure, comprising:
   forming a capacitor dielectric stacked layer on a first electrode, wherein the capacitor dielectric stacked layer comprises:
      a first dielectric layer comprising:
         a first zirconium oxide layer; and
         a first zirconium silicon oxide layer; and
      an aluminum oxide layer, wherein the first dielectric layer is disposed between the aluminum oxide layer and the first electrode, and a thickness of the first zirconium oxide layer is greater than a thickness of the aluminum oxide layer; and
   forming a second electrode on the capacitor dielectric stacked layer, wherein the capacitor dielectric stacked layer is located between the first electrode and the second electrode.

2. The manufacturing method of the capacitor structure according to claim 1, wherein the first zirconium silicon oxide layer is formed by an atomic layer deposition process, and the atomic layer deposition process comprises:
   performing a first step for introducing a zirconium precursor;
   performing a second step after the first step for removing the zirconium precursor;
   performing a third step after the second step for introducing a first oxidizing agent;
   performing a fourth step after the third step for removing the first oxidizing agent;
   performing a fifth step after the fourth step for introducing a silicon precursor;
   performing a sixth step after the fifth step for removing the silicon precursor;
   performing a seventh step after the sixth step for introducing a second oxidizing agent;
   performing an eighth step after the seventh step for removing the second oxidizing agent; and
   repeating the first step to the eighth step.

3. The manufacturing method of the capacitor structure according to claim 2, wherein the first step to the eighth step are repeated at least three times, and an end step is the fourth step.

4. The manufacturing method of the capacitor structure according to claim 1, wherein the first zirconium silicon oxide layer is formed by an atomic layer deposition process, and the atomic layer deposition process comprises:
   performing a first step for introducing a silicon precursor;
   performing a second step after the first step for removing the silicon precursor;
   performing a third step after the second step for introducing a first oxidizing agent;
   performing a fourth step after the third step for removing the first oxidizing agent;
   performing a fifth step after the fourth step for introducing a zirconium precursor;
   performing a sixth step after the fifth step for removing the zirconium precursor;
   performing a seventh step after the sixth step for introducing a second oxidizing agent;
   performing an eighth step after the seventh step for removing the second oxidizing agent; and
   repeating the first step to the eighth step.

5. The manufacturing method of the capacitor structure according to claim 4, wherein the first step to the eighth step are repeated at least three times, and an end step is the fourth step.

6. The manufacturing method of the capacitor structure according to claim 1, wherein an atomic percentage of zirconium in the first zirconium oxide layer is higher than an atomic percentage of zirconium in the first zirconium silicon oxide layer.

7. The manufacturing method of the capacitor structure according to claim 1, wherein the thickness of the first zirconium oxide layer is greater than a thickness of the first zirconium silicon oxide layer.

8. The manufacturing method of the capacitor structure according to claim 1, wherein the capacitor dielectric stacked layer further comprises:
 a second dielectric layer disposed between the aluminum oxide layer and the second electrode, wherein the second dielectric layer comprises a second zirconium oxide layer.

9. The manufacturing method of the capacitor structure according to claim 8, wherein the second dielectric layer further comprises:
 a second zirconium silicon oxide layer, wherein the second zirconium oxide layer and the second zirconium silicon oxide layer are formed by atomic layer deposition processes.

10. The manufacturing method of the capacitor structure according to claim 1, wherein the first dielectric layer further comprises:
 a third zirconium oxide layer, wherein the first zirconium silicon oxide layer is disposed between the first zirconium oxide layer and the third zirconium oxide layer; and
 a silicon oxide layer disposed between the first zirconium oxide layer and the third zirconium oxide layer.

11. A manufacturing method of a capacitor structure, comprising:
 forming a capacitor dielectric stacked layer on a first electrode, wherein the capacitor dielectric stacked layer comprises:
  a first dielectric layer comprising:
   a first zirconium oxide layer;
   a first zirconium silicon oxide layer;
   a second zirconium oxide layer, wherein the first zirconium silicon oxide layer is disposed between the first zirconium oxide layer and the second zirconium oxide layer; and
   a silicon oxide layer disposed between the first zirconium oxide layer and the second zirconium oxide layer; and
 forming a second electrode on the capacitor dielectric stacked layer, wherein the capacitor dielectric stacked layer is located between the first electrode and the second electrode.

12. The manufacturing method of the capacitor structure according to claim 11, wherein the first zirconium silicon oxide layer is formed by an atomic layer deposition process, and the atomic layer deposition process comprises:
 performing a first step for introducing a zirconium precursor;
 performing a second step after the first step for removing the zirconium precursor;
 performing a third step after the second step for introducing a first oxidizing agent;
 performing a fourth step after the third step for removing the first oxidizing agent;
 performing a fifth step after the fourth step for introducing a silicon precursor;
 performing a sixth step after the fifth step for removing the silicon precursor;
 performing a seventh step after the sixth step for introducing a second oxidizing agent;
 performing an eighth step after the seventh step for removing the second oxidizing agent; and
 repeating the first step to the eighth step.

13. The manufacturing method of the capacitor structure according to claim 11, wherein the first zirconium silicon oxide layer is formed by an atomic layer deposition process, and the atomic layer deposition process comprises:
 performing a first step for introducing a silicon precursor;
 performing a second step after the first step for removing the silicon precursor;
 performing a third step after the second step for introducing a first oxidizing agent;
 performing a fourth step after the third step for removing the first oxidizing agent;
 performing a fifth step after the fourth step for introducing a zirconium precursor;
 performing a sixth step after the fifth step for removing the zirconium precursor;
 performing a seventh step after the sixth step for introducing a second oxidizing agent;
 performing an eighth step after the seventh step for removing the second oxidizing agent; and
 repeating the first step to the eighth step.

14. The manufacturing method of the capacitor structure according to claim 11, wherein an atomic percentage of zirconium in the first zirconium oxide layer is higher than an atomic percentage of zirconium in the first zirconium silicon oxide layer.

15. The manufacturing method of the capacitor structure according to claim 11, wherein a thickness of the first zirconium oxide layer is greater than a thickness of the first zirconium silicon oxide layer.

16. The manufacturing method of the capacitor structure according to claim 11, wherein the capacitor dielectric stacked layer further comprises:
 an aluminum oxide layer, wherein the first dielectric layer is disposed between the aluminum oxide layer and the first electrode, and a thickness of the first zirconium oxide layer is greater than a thickness of the aluminum oxide layer; and
 a second dielectric layer disposed between the aluminum oxide layer and the second electrode, wherein the second dielectric layer comprises a zirconium oxide layer.

17. A manufacturing method of a capacitor structure, comprising:
 forming a capacitor dielectric stacked layer on a first electrode, wherein the capacitor dielectric stacked layer comprises:
  a dielectric layer comprising a plurality of zirconium oxide layers and a plurality of zirconium silicon oxide layers alternately stacked, wherein a thickness of each of the zirconium oxide layers is greater than a thickness of each of the zirconium silicon oxide layers; and
 forming a second electrode on the capacitor dielectric stacked layer, wherein the capacitor dielectric stacked layer is located between the first electrode and the second electrode.

18. The manufacturing method of the capacitor structure according to claim 17, wherein each of the zirconium silicon oxide layers is formed by an atomic layer deposition process, and the atomic layer deposition process comprises:
   performing a first step for introducing a zirconium precursor;
   performing a second step after the first step for removing the zirconium precursor;
   performing a third step after the second step for introducing a first oxidizing agent;
   performing a fourth step after the third step for removing the first oxidizing agent;
   performing a fifth step after the fourth step for introducing a silicon precursor;
   performing a sixth step after the fifth step for removing the silicon precursor;
   performing a seventh step after the sixth step for introducing a second oxidizing agent;
   performing an eighth step after the seventh step for removing the second oxidizing agent; and
   repeating the first step to the eighth step.

19. The manufacturing method of the capacitor structure according to claim 17, wherein each of the zirconium silicon oxide layers is formed by an atomic layer deposition process, and the atomic layer deposition process comprises:
   performing a first step for introducing a silicon precursor;
   performing a second step after the first step for removing the silicon precursor;
   performing a third step after the second step for introducing a first oxidizing agent;
   performing a fourth step after the third step for removing the first oxidizing agent;
   performing a fifth step after the fourth step for introducing a zirconium precursor;
   performing a sixth step after the fifth step for removing the zirconium precursor;
   performing a seventh step after the sixth step for introducing a second oxidizing agent;
   performing an eighth step after the seventh step for removing the second oxidizing agent; and
   repeating the first step to the eighth step.

20. The manufacturing method of the capacitor structure according to claim 17, wherein an atomic percentage of zirconium in each of the zirconium oxide layers is higher than an atomic percentage of zirconium in each of the zirconium silicon oxide layers.

* * * * *